United States Patent

Manicki

[15] 3,643,168

[45] Feb. 15, 1972

[54] SOLID-STATE TUNED UHF TELEVISION TUNER

[72] Inventor: Gert L. Manicki, Port Credit, Ontario, Canada

[73] Assignee: Standard Kallsman Industries Inc., Melrose Park, Ill.

[22] Filed: July 7, 1969

[21] Appl. No.: 839,169

[52] U.S. Cl. ....................325/459

[51] Int. Cl. ....................H04b 1/06

[58] Field of Search ..........325/452, 457, 459, 461, 462, 325/464, 465, 468, 363; 334/14; 330/30; 29/626

[56] References Cited

UNITED STATES PATENTS

| | | | |
|---|---|---|---|
| 2,978,655 | 4/1961 | Fernsler | 325/363 X |
| 3,482,178 | 12/1969 | Habian | 330/30 |
| 3,505,620 | 4/1970 | Minger | 325/459 X |
| 3,516,155 | 6/1970 | Smith | 29/626 |
| 3,544,903 | 12/1970 | Sakamoto | 325/459 |

*Primary Examiner*—Richard Murray

*Attorney*—E. Manning Giles, J. Patrick Cagney and Peter S. Lucyshyn

[57] ABSTRACT

A solid-state voltage-controlled capacitor (varactor or varicap) UHF television tuner is described which includes a varicap preselector tuned circuit, a varicap tuned RF amplifier stage inductively coupled to the preselector circuit, and a varicap tuned oscillator stage, both the oscillator stage and the amplifier stage being inductively coupled to the diode mixer stage from which an IF signal is derived. The tuner employs a single tuning voltage source to tune across the entire UHF range and also includes provision for AGC. Trimmer capacitors and inductance adjusting devices of unique and advantageous configuration are employed to align the tuner. Further disclosed are unique methods of assembly and alignment for the tuner.

7 Claims, 11 Drawing Figures

INVENTOR
Gert L. Manicki

BY Richard G. Kinney
ATTORNEY

INVENTOR
Gert L. Maric̆
BY Richard G. Kinney
ATTORNEY

INVENTOR
Gert L. Manicki
BY Richard G. Kinney
ATTORNEY

SOLID-STATE TUNED UHF TELEVISION TUNER

BACKGROUND OF THE INVENTION

The present invention relates to ultra-high-frequency (UHF) tuners of unique construction and the methods of manufacture and alignment of such tuners.

In the United States and also in Canada, the government has allocated three ranges or bands in the electromagnetic radio spectrum for television broadcast and reception. These are from 54 to 88 megahertz (MHz.), from 174 to 216 MHz., and from 570 to 890 MHz. These ranges or bands are further divided into individual small ranges commonly called "channels" each being 6 MHz. wide. There are thus five channels in the first band, seven in the second band, and 70 in the third band. By convention the lowest frequency channel, that is, from 54 to 60 MHz., is designated channel 2, while each progressively higher frequency channel is designated by the next highest number. Thus, channels 2–6 are in the first band, channels 7–13 in the second band, and channels 14 to 83 in the third band.

The lower two bands (channels 2–13), despite the gap between them, are conventionally referred to as a single band, namely, the Very High Frequency or VHF band. The other band (channels 14–83) is referred to as the Ultra High Frequency or UHF band. Herein the above-defined UHF band will be designated the American UHF band to differentiate it from the European bands that are sometimes also termed UHF but differ considerably from the U.S. and Canadian frequency range. The 6 MHz. wide television signal standards are unique in radio communication in that the signal is a wide band having a video carrier, with vestigial sideband and a separate FM carrier. In addition, for color broadcast, a subcarrier is modulated upon the video carrier.

Because of the great disparity between the VHF and the American UHF frequency ranges, it is the normal practice to employ two tuners in a television set designed to receive both bands. Heretofore, all known commercially successful American UHF tuners have been of the ganged capacitor plate type, that is, a tuner which tunes or selects a single channel in the UHF range by varying the physical interrelationship of a plurality of capacitor blades. While these tuners are entirely adequate for many applications, they are not completely compatible with the more modern solid state television sets and solid state VHF tuners. Furthermore, this conventional type of tuner requires special and complex provisions when remote control operation is desired and has other problems (such as microphonic oscillations caused by physical movement of the capacitor blades).

The present invention provides the first practical solid state tuner capable of tuning the American UHF frequency band. While other solid state television tuners have been developed, these have all been concerned with lower frequency bands or less expansive bands. An example of such a solid-state tuner in the VHF band is described and claimed in U.S. Pat. No. 3,354,391 which issued in the name of Karl H. Wittig on Sept. 27, 1967, entitled "Voltage-Variable Diode Capacitance Tunable Circuit for Television Apparatus" and is assigned to the same assignee as the present invention.

Another example of such a tuner, again for the VHF band, in U.S. application Ser. No. 671,011 filed on Sept. 27, 1967, in the names of Thomas F. Gossard and Mutsuo Nakanishi, entitled "Solid State Television Tuner," which is also assigned to the assignee of the present invention.

SUMMARY OF THE INVENTION

A UHF television tuner constructed in accordance with the present invention includes a preselector tuned circuit having a solid state voltage controlled capacitor as its tunable element, a radio frequency amplifier coupled to the preselector circuit and also including a second solid state voltage controlled capacitor as its tunable element, an oscillator stage including a third solid-state voltage-controlled capacitor tunable element, and a mixer stage coupled to both the oscillator stage and the radio frequency amplifier stage, from which mixer stage an intermediate frequency output signal is obtained. The three circuits are voltage tuned in common.

Other features of the invention include the provision of such a tuner employing four tuned stages tuned in common to provide even greater selectivity; the provision of a diode in the mixer stage; the provision of inductive coupling between the preselector circuit and the RF amplifier stage and between the RF amplifier and the mixer stage and also between the oscillator stage and the mixer stage; the provision of a spacially variable shield adjacent to an inductive coupled element to adjust the inductance of those elements; the use of metal segments as both inductive elements in conjunction with each of the varactor diode tuned circuits and as variable capacitive elements; and the use of a spacially formed shorted turn between the double tuned circuits of the four circuit tuner to adjust the coupling between those circuits.

Another aspect of the invention involves the use of the leads of elements such as the diode of the mixer and the transistor of the RF amplifier arranged in the configuration to serve themselves, as inductive circuit elements obviating the necessity of additional discrete circuit elements.

Another feature of the invention is the method of manufacturing the tuner wherein the varactor diodes are mounted as a single set in essentially one step, thereby preventing or lessening the danger of mismatching varactor diodes.

Yet another feature of the invention lies in the test and alignment method whereby the assembled tuner may be quickly and efficiently tested, aligned and made ready for installation and use in a television receiver.

BRIEF DESCRIPTION OF THE DRAWINGS

The features of this invention which are believed to be novel are set forth with particularity in the appended claims. The invention, together with further features and advantages thereof, may best be understood, however, by reference to the following description taken in conjunction with the accompanying drawings, in the figures of which the numerals identify like elements, and in which:

DETAILED DESCRIPTION OF THE PREFERRED EMBODIMENTS

Figure 1:
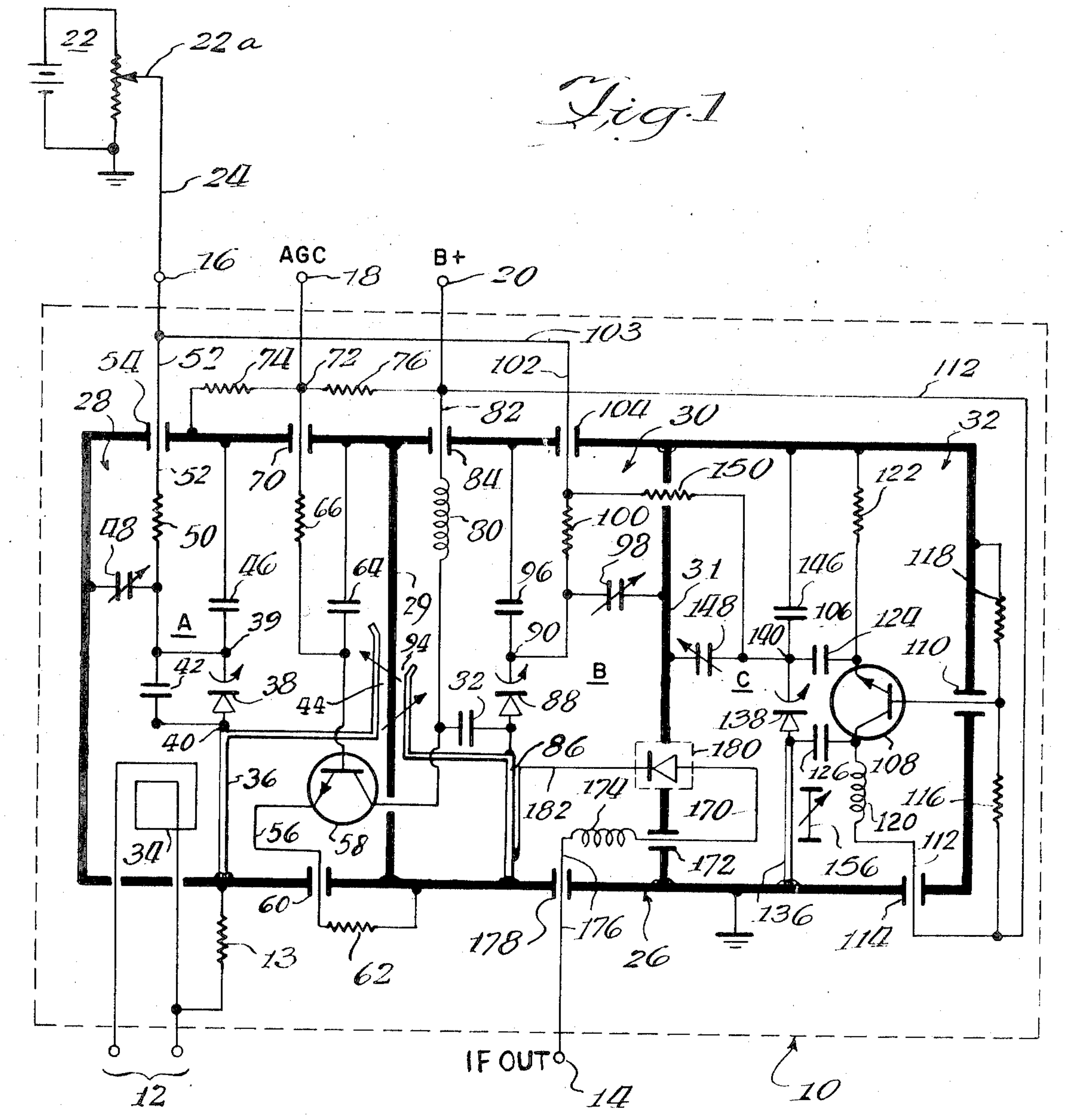
FIG. 1 is a generally schematic circuit diagram partially in pictorial form of the UHF tuner of the present invention and associated circuitry in an environment of use.
Figure 2:
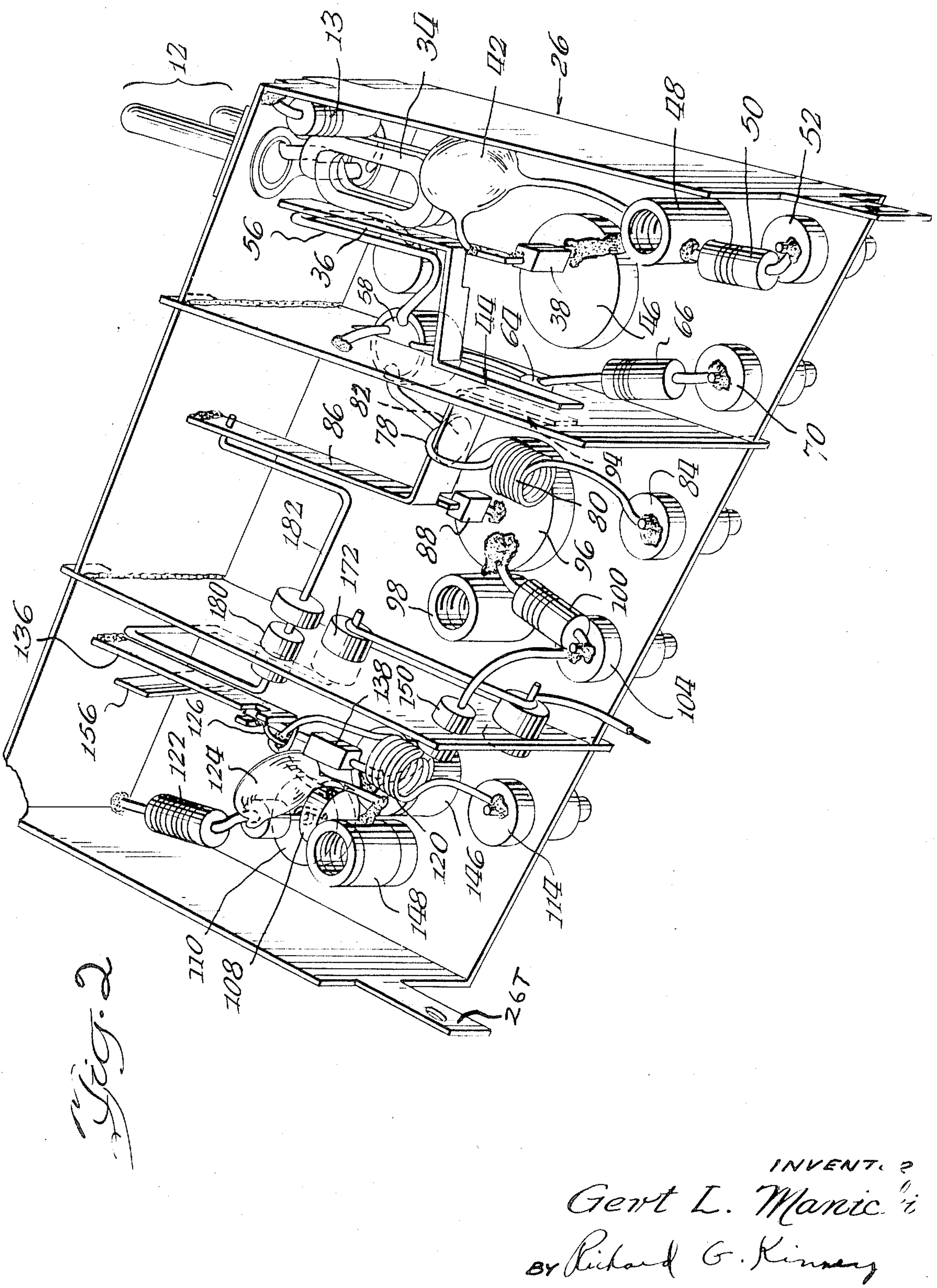
FIG. 2 is a perspective view of the UHF tuner of FIG. 1 with a cover (not shown) removed to show interior parts and their orientation.

In the drawing of FIG. 1, a hybrid schematic circuit—pictorial diagram is employed both because this represents the common practice in this particular art, and also because at the frequencies involved, lumped circuit elements as conventionally pictured would be somewhat misleading. For example, at these frequencies, an essentially inductive element may be a single straight wire or a few turns of a wire. Thus the use of the conventional low frequency inductor symbol of a multiple turn coil might mislead a casual observer into mistaking the nature of the physical entity. FIG. 2 represents the actual layout of the elements in this preferred embodiment of the invention.

Referring to FIGS. 1 and 2 there is depicted a UHF tuner constructed in accordance with the present invention which tuner is generally designated by the numeral 10. The tuner 10 has a pair of antenna input terminals 12, to which are coupled the leads from a suitable UHF type antenna (not shown) or other source of UHF television signals. In accordance with normal safety standards, one of the terminals 12 is connected to a resistor 13 which provides a static electric discharge path to ground.

An IF OUT terminal 14 is also provided for coupling the intermediate frequency (IF) signal to the remainder of the television receiver. It should be understood that the primary general function of the tuner 10 is to receive one or more radio frequency (RF) modulated signals at the antenna inputs such as terminals 12 and to select one signal or channel and to produce an intermediate frequency (IF) signal at its output terminal such as the terminal 14, with such IF signal being modulated with the same information as the chosen channel. Once derived from a tuner (either VHF or UHF) the modulated IF signal is amplified and detected in the television receiver and ultimately converted into the familiar visual display and sound of transmitted television program.

The tuner 10 also includes three other input terminals: a tuning control voltage input terminal 16, an automatic gain control (AGC) input terminal 18 and a power supply input voltage (B+) terminal 20.

The terminal 16 receives a variable direct current (DC) tuning voltage from a source generally designated 22 and schematically represented in FIG. 1 by a positive voltage source across a movable tapped resistor whose tap **22*a* is connected, via a line 24, to the input terminal 16**. The function of this tuning voltage is to select the particular frequency channel desired by the user. It is therefore selectively variably by the user. It should be understood that numerous alternative tuning voltage sources and switching arrangements could be employed.

The AGC signal is also a voltage of low level that is conventionally developed by the receiver circuitry and varies with the strength of the detected signal. The function of this AGC voltage is to vary the amplitude of the IF output signal at the terminal 14 in such a manner as to achieve a more uniform derived video signal. The tuner 10 will operate successfully without provision for AGC and in some commercial television receivers an AGC system is not employed. In this case the tuner 10 can still be used with the terminal 18 left unconnected or eliminated entirely. The B+ source may be any conventional power source, as is available in the television receiver.

Figure 3:
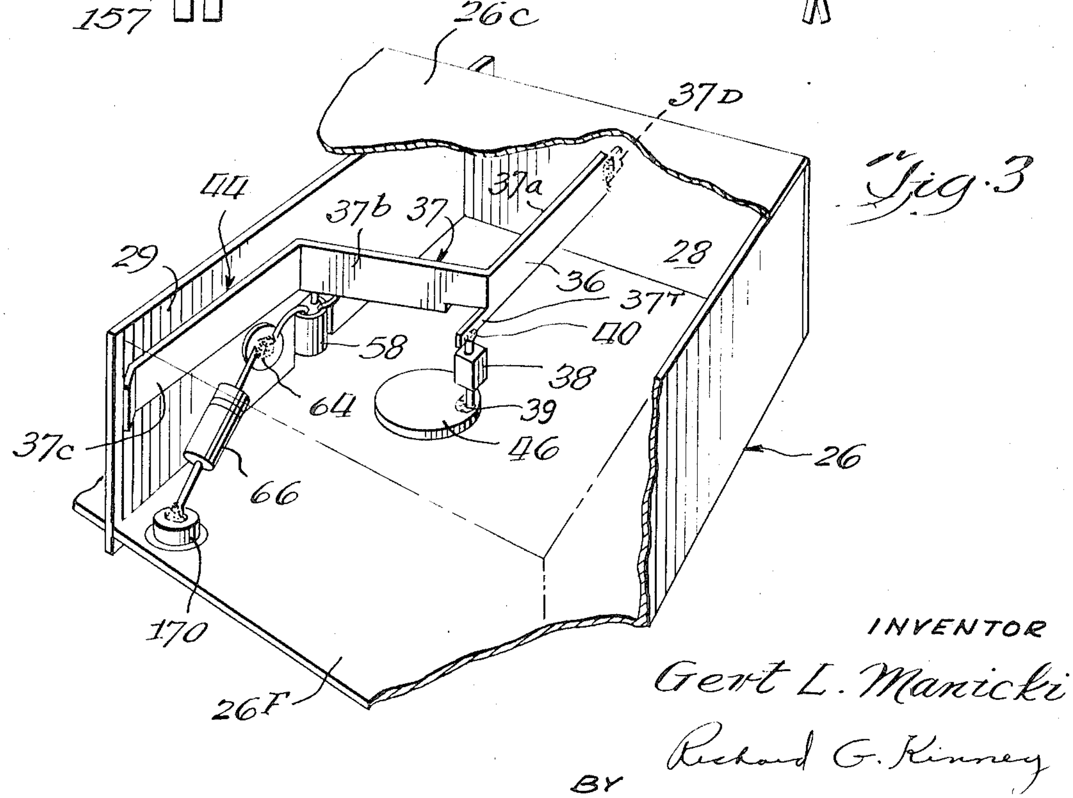
FIG. 3 is a perspective view of a portion of the tuner of FIGS. 1 and 2 with certain parts removed to better show the configuration, orientation and interrelation within the tuner of certain other parts, primarily a combined inductive and variable capacitance element.

The tuner 10 is primarily contained within a generally rectangular metal closed chassis or housing 26 (FIG. 2), which is divided into three cavities, generally designated 28, 30, and 32, by means of an interior wall 29 between the first cavity 28 and the centrally located cavity 30, and a second interior wall 31 between the central cavity 30 and the third cavity 32. This first wall 29 functions to shield the radio frequency input and amplifier and is therefore often termed herein the RF shield. Similarly the second wall 31 functions to shield the oscillator circuit and is often termed the oscillator shield. The housing 26 further includes top and bottom end walls, a floor 26F and a cover 26C (FIG. 3). The housing 26 is preferably electrically connected to the chassis of the receiver in which it is employed. In any event, the electric potential of the housing 26 is taken as the plane of reference potential or ground for purposes of this description.

As best shown in FIGS. 1 and 2, the antenna terminals 12 pass through the housing 26 into the first cavity 28 where they form either end of a three turn coil 34.

A circuit element 36 which will be herein referred to as an inductor, is inductively coupled to the antenna coil 34 and is provided within the cavity 28. One end of the inductor 36 is grounded while the other end is connected at a circuit junction 40 to one end of a solid state voltage variable capacitor 38 which is of the voltage variable capacitance diode type, and which is sometimes termed a varactor or a varicap. The inductor 36 is in some respects like a transmission line or coaxial line with the housing 26 being the outer conductor. The use of such elements is per se old. The varicap 38 has its anode connected to the inductor 36 at the junction point 40 and its cathode connected through a capacitor 46 to ground. The anode of the varicap 38 is also connected through a trimmer capacitor 44 to ground. As used herein the terms anode and cathode are applied to those terminals of a diode, such as the diode 38, respectively, from which and to which conventional electric current would flow with the least impedance. This is a conventional definition but it should be recognized that the diodes herein are solid state devices and thus do not have true thermionic "cathodes" or "anodes." Also it should be understood that many of the diodes herein described are employed in a normally back-biased state. That is, in a bias state in which very little current flows through them.

As is best shown in FIG. 3, the inductor 36 and the trimmer capacitor 44 are preferably constructed from a unitary member, generally designated 37. The member 37 is formed from a flat conductive wire segment to have an overall generally Z shape with three distinct segments **37*a*, 37*b*, and 37*c*. The segment 37*a* has one longitudinal end seated in and soldered, at 37D, to one wall of the housing 26. The other extreme longitudinal end of the segment 37*a* merges with the second segment 37*b* which is bent therefrom at approximately a right angle and has a tab extension 37T to which the cathode terminal of the varicap 38 is soldered, at 40. The center segment 37*b* serves to connect the junction 40 with the third segment 37*c*. This segment 37*c* is positioned in a plane approximately parallel to the dividing interior wall 29. This grounded wall 29 and the segment 37*c* form the trimmer capacitor 44**.

As also is best shown in FIG. 3, the cathode of the varicap 38 is preferably soldered, at 39, directly to the upper electrode of the capacitor 46 which is, as shown, preferably a leadless ceramic disc capacitor having its bottom electrode soldered directly to the floor 26F of the housing 26.

The member 27 is thus secured at two places, **37*d* and 40, and the sections 37*b* and 37*c* are cantilevered out from the Section 37. With this relationship the positioning of the portion 37*c* may be adjusted by bending it in or out from the wall 29 to thereby adjust the effective capacitance of the trimmer capacitor 44** formed thereby.

The section **37*a* of the member 37, which forms the inductor 36, is orientated such that the wide portions of the flat wire are facing the sides of the cavity 28 and the narrow portions are facing the bottom and the side that is, in operation, covered by the cover 26C**.

It should be noted that the orientation of the flat wire as just described is important. In a cavity resonant circuit an electric field is produced which is proportional to width of the inner conductor **37*a* to all walls of the cavity 28. In this case the field is strongest in relation to the sides of the cavity, and weak to the bottom (floor 26F) and the top (cover 26C**). with this design the presence or the absence of the cover does not appreciable upset the resonant frequency of the tuned circuit, thereby facilitating alignment.

Referring again to FIGS. 1 and 2, across the varactor 38 is an additional capacitor 42, preferably of the conventional disc type. Also connected between the junction 39 and ground are two capacitors, relatively large fixed capacitor 46 and a variable trimmer capacitor 48. Also electrically connected to the junction point 40 is one end of an isolation resister 50 whose other end is connected to a line 52 which passes through a feedthrough capacitor 54 mounted through the housing 26.

The capacitors 42, 46, 44 and 48 together with the capacitance of the varactor 38 and the effective inductance of the inductor 36 constitutes a preselector tuned or tank circuit which is generally designated by the letter A in FIG. 1.

Inductively coupled to the inductor 36 is an inductor 56 which is preferably a single partial square loop positioned within the cavity 28 adjacent to, but spaced from the inductor 36 on the opposite side thereof from the antenna loop 34. One end of the inductor 56 is connected to the emitter of a radiofrequency (RF) NPN-transistor 58 mounted primarily within the cavity 28 but extending in part through the wall 29 into the cavity 39 (FIG. 2). The other end of the inductor 56 passes through a feedthrough capacitor 60 to be connected to one end of a resistor 62 outside the housing 26 (FIG. 1). The resistor 62 has its other end grounded and serves as a DC biasing resistor for the transistor 58.

The base of the RF transistor 58 is connected through a relatively large capacitor 64 to ground and also to one end of a relatively large resistor 66. The capacitor 64 serves as an RF ground while the resistor 66 is an isolation resistor that provides both DC biasing and gain control. The other end of this resistor 66 is connected to a line 68 that passes through a feedthrough capacitor 70 to a junction point 72 outside of the housing 26. The junction point 72 is connected to and is electrically the same point as the AGC input terminal 18.

The junction 72 is connected through a resistor 74 to ground and is also connected through a voltage dropping resistor 76 to the B+ voltage source input terminal 20. The resistors 74 and 76 provide a voltage dividing network for supplying a DC operating bias to the base of the transistor 58. This DC operating bias voltage may be further modified by the voltage at the AGC terminal 18 to adjust the gain of the transistor 58.

The transistor 58 is mounted partially through the wall 29 so that its collector is in the central cavity 30 where it is electrically connected to a junction point 78. Also connected to junction point 79 is one end of an RF choke coil 80 whose other end is connected to a line 83 which passes through a feedthrough capacitor 84 to be connected to the B+ voltage source terminal 20.

Junction point 78 is also connected through a DC blocking capacitor 83 to one end of a solid-state voltage variable capacitor 88 of the varicap diode type. This end of the varicap 88 is connected to one end of an inductor 86 which is preferably constructed and connected as was the inductor 36 (FIG. 3). The other end of the varicap 88 is connected to a circuit junction point 90. When a positive voltage is applied to the junction point 90 the diode 88 is reverse biased and there is effectively no current flow therethrough. This point 90 is connected through the parallel circuit connection of a fixed capacitor 96 and a variable trimmer capacitor 98 to ground.

A second variable capacitor 94 is connected from the junction of inductor 86 and varactor 88 to ground. The capacitor 94 is constructed substantially as was the capacitor 44 (FIG. 3).

The end of the resistor 100 remote from the junction point 90 is connected to a conductor 102 which passes through a feedthrough capacitor 104 to be connected, outside the housing 26, to the tuning voltage input terminal 16 via a line 103.

The capacitors 94, 96 and 98 together with the capacitance of the varactor 88 and the effective inductance of the inductor 86 constitutes a second tuned tank circuit which is generally designated by the letter B in FIG. 1.

This tuned circuit B constitutes the load for the RF transistor 58 and together with the biasing components and that transistor comprises a tuned RF amplifier.

Further provided in the tuner 10 is a unique oscillator circuit generally designated 106 which is housed in the third portion or cavity 32 of the housing 26. This circuit 106 includes a third tuned tank circuit generally designated by the letter C and a radiofrequency-type NPN-transistor 108 and its associated circuitry. The transistor 108 has its base coupled through a capacitor 110 to ground. The capacitor 110 may be of the feedthrough type as shown or of a conventional type. The operating DC bias voltage for the transistor 108 is provided from the B+ source input terminal 20 via a line 112 which enters the housing cavity 32 through a feedthrough capacitor 114. The bias voltage of line 112 is supplied to the base of the transistor 108 through a voltage dropping resistor 116 mounted without the housing 26. This resistor 116 forms, with a second resistor 118 connected from the base to ground, a voltage-dividing network. These two resistors 116 and 118 are preferably mounted without of the housing 126 as shown, but may also be mounted within the cavity 32, if desired. In that case the capacitor 110 may be a conventional capacitor. The DC bias voltage of line 112 is supplied to the collector of transistor 108 through an RF choke coil 120. The emitter of the transistor 108 is connected through resistor 122 to ground.

The emitter of the transistor 108 is connected through a capacitor 124 to a junction point 140. This point 140 is also connected through a fixed capacitor 146 and through a variable trimmer capacitor 148 in parallel to ground. The point 140 is also connected to the cathode of a third solid-state voltage-variable capacitor 138 of the varicap or varactor type whose anode is connected to an inductor 136.

The varicap 138 is connected so that it is reversed biased and there is effectively no conventional current flow from the inductor to the junction point 140.

Figure 4A:
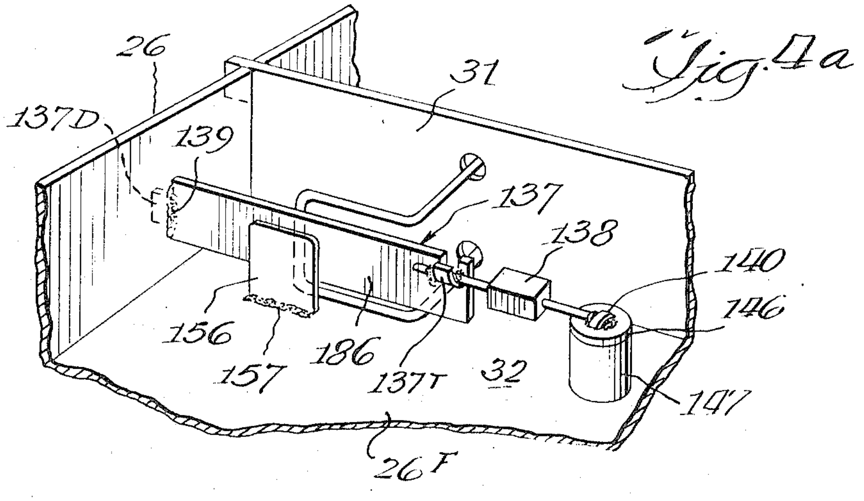
FIG. 4A is a perspective view of another portion of the tuner of FIGS. 1–3, showing other parts, primarily a variable-impedance device, and the configuration, orientation and interrelation within the tuner of these parts.

As is best shown is FIG. 4A the inductor 136 is preferably in the form of a member 137 which is somewhat similar in overall orientation, configuration and connection to the first or inductor segment 37A of the member 37 (FIG. 3). That is, the member 137 is formed from a straight flat wire segment which has one end with a tab extension 137D fitted into a correspondingly sized aperture in the bottom side wall of the housing 26 and soldered, at 139, thereto, so as to be cantilevered therefrom within the cavity 32. The member 137 is slightly wider than the member 37A but is orientated in the same manner so as to have its flat portions facing the side wall 31 and the inside of the end wall of the housing 26, while having its bottom and top edges parallel to but spaced from the housing floor 26F and cover 26C.

The varicap 138 is connected to the extreme end of the member 137 away from the connection 139, by being seated in a bifurcation formed by a bent out tab 137T and is there soldered. The other electrode of the varicap 138 is soldered to one side of the capacitor 146 which is preferably of the leadless disc capacitor type and whose other side is soldered to a conductive stanchion 147.

The varactor 138 is normally back-biased with a DC tuning control voltage derived from the input terminal 16. This control voltage is impressed via the line 103, and the line 102, through the housing 26 via the feedthrough capacitor 104 to one end of a current limiting and isolation resistor 150 within the cavity 30. The other end of the resistor 150 is in circuit connection with the junction point 140 in the cavity 32. The body of the resistor 150 may be conveniently positioned so as to pass through a hole formed in the wall 31 which divides the two cavities 30 and 32. This construction not only eliminates the need for an additional feedthrough capacitor into the cavity 32 but also provides a convenient mounting for the resistor 150 and aids in the assembly of the tuner 100.

The capacitors 146 and 148 together with the capacitance of the varactor 138 and the inductance of inductor 136 constitute the third tuned tank circuit generally designated C in FIG. 1.

The circuit C is coupled to the transistor 108 via a relatively large capacitor 126 connected between the collector of the transistor 108 and the junction of varactor 138 and inductor 136. A small capacitor 124 is connected between the emitter of transistor 108 and the junction point 140 to provide frequency-compensated feedback in order to maintain more constant amplitude of oscillation.

Figure 4B:
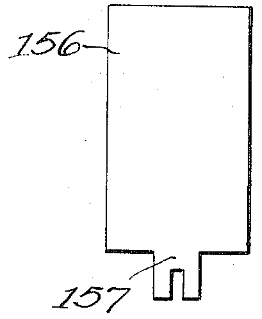
FIGS. 4B and 4C are respectively an elevational plan view and elevational side view of the impedance device shown in FIG. 4A.
Figure 4C:
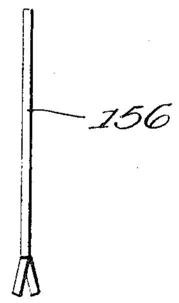

Provided adjacent to the inductor 136 is a unique impedance adjustment device 156. As best shown in FIG. 4A, the device 156 comprises a generally rectangular and planar metal plate which is soldered at 157 to the floor 26F of the housing adjacent to, but spaced from, the inductor 136. The variable impedance device 156 is varied by bending it toward or away from the inductor 136. As best shown in FIGS. 4A and 4B the device 156 includes a bifurcated tab 156T which serves together with a corresponding slot in the housing to properly locate its position and to facilitate assembly of the tuner 100.

Referring again to FIGS. 1 and 2, it can be appreciated that the output of the oscillator 106 is inductively coupled from the inductor 136 to an inductor 170 formed as a partial square loop within the cavity 32. One end of the inductor 170 passes through a feedthrough capacitor 172 in wall 31 into the central cavity 30. It is there connected to one end of a radio frequency choke coil 174. The other end of coil 174 is connected to a line 176 which passes through a feedthrough capacitor 178 to the intermediate frequency signal output terminal 14 without the housing 26.

The other end of the loop of inductor 170 is connected to the anode of a mixer diode 180 which itself is positioned in and passes through the wall 31 so as to be partly within the central cavity 30 and partly within the oscillator cavity 32. As in the case of the resistor 150 this construction facilitates assembly and avoids the necessity of additional parts. The cathode of the diode 180 is connected to one end of a partial loop inductor 182 which is positioned so as to be inductively coupled to the inductor 86 and has its other end grounded.

In the above description of the tuner 10 the transistors 58 and 108 were termed RF-type transistors and similarly the coils 80 and 174 were termed RF chokes. By this it is meant that these transistors are of the type that can amplify signals of the general frequency ranges involved in American UHF television and that the coils represent a very high impedance to signals in that frequency range. It should be noted that the oscillator transistor 108 does not deal directly with any received radio frequency signals.

OPERATION

In overall operation the tuner 10 receives one or more American UHF carrier signals at its antenna input terminals 12, selects one particular UHF input signal and translates the information on that signal from the particular UHF carrier frequency to an intermediate frequency or IF signal which is developed between IF OUT terminal 14 and ground. It does this by employing the superheterodyne principle.

The received UHF signal or signals are coupled from the antenna loop 34 to the inductor 36. Depending upon the DC potential applied from the varactor or varicap control voltage source 22 to input terminal 16 (which is applied through the line 52, the resistor 50 and the terminal 40 to the varactor 38) the preselector circuit A can be tuned to the approximate UHF carrier frequency of a desired received UHF signal. For other UHF signals the circuit A is detuned resulting in a substantial attenuation of these signals relative to the tuned signal.

The selected or preselected UHF signal is coupled through the inductor 56 to the RF amplifier transistor 58. The load circuit of the transistor 58 is the tuned circuit B. This circuit is substantially a twin to the circuit A and the same input tuning voltage present at input terminal 16 adjusts (through lines 103, 102, resistor 100 and terminal 90) the effective capacitance of the varactor or varicap 88 to tune this circuit to substantially the same UHF frequency preselected by circuit A. This selected and amplified UHF signal is coupled to the mixer stage through the coupled inductors 86 and 182. At the same time the oscillator circuit 106 is tuned to oscillate at a frequency determined by the third tuned circuit C. The same tuning voltage at terminal 16 that tunes the circuits A and B also tunes the circuit C. This voltage which is applied through line 103, the line 102, the resistor 150 and the terminal 140 to the varicap or varactor 1 38 controls the oscillator frequency coupled from the inductor 136 to the inductor 170 of the diode mixer stage.

The circuit C, however, unlike the circuits A and B is not tuned to resonate at the desired UHF carrier frequency but is instead tuned to a frequency differing from that frequency by an amount equal to the intermediate frequency.

Thus, when channel 80, for example, is desired, the circuits A and B will be tuned to pass and amplify the channel frequencies 866–872 MHz. and the circuit C would be tuned to the IF frequency higher, for example, 45.25 MHz. above the 867.25 MHz. UHF video carrier frequency or 912.5 MHz.

The oscillator frequency signal and the amplified UHF carrier frequency signal are "mixed" or heterodyned in the mixer stage which includes the diode 180 and the inductors 170 and 182. The heterodyning of this oscillator frequency and the channel 80 signal results in a modulated video IF carrier of 45.25 MHz. and, incidentally also results in a modulated sound IF carrier of 41.75 MHz. as the channel 80 signal includes a sound carrier at 871.75 MHz. within its 6 MHz. band. Although the term IF is used herein in a singular sense, it should be recognized that this term includes the sound as well as the video carrier signals.

The output from the mixer stage is passed through the inductor or choke 174, to the IF OUT terminal 14. The choke 174 is a high impedance to the relatively higher UHF and oscillator frequency signal, but not to the intermediate frequency signals.

For completeness of the disclosure of and for illustration of the invention, but not for limiting the breadth of the present invention, the following exemplary values and definitions for the elements of the tuner 10 are hereinafter set out:

| Element | Value or Type or Description |
|---|---|
| Transistor 38 | BF 180 |
| Transistor 108 | SE 3005 (Fairchild) |
| Vari-cap 38, 88 and 138 | BB 105B |
| Mixer Diode 180 | A1113 (Texas Instruments) |
| Resistor 62 | 330 |
| Resistor 74 | 680 |
| Resistor 122 | 820 |
| Resistor 66 | 1000 |
| Resistor 118 | 2.7 K |
| Resistor 116 | 3.3 K |
| Resistor 76 | 4.7 K |
| Resistor 50, 100 and 150 | 10 K |
| Feedthrough Capacitors 54,60,70,84,104,114, 154 & 178 | 1000 pF |
| Feedthrough Capacitor 172 | 24 ppf |
| Trimmer Capacitors 48 and 98 | 2–8 pF |
| Trimmer Capacitor 148 | 0.5–4.5 pF |
| Capacitors 46 and 96 | 15 pF (disc) |
| Capacitors 64 and 110 | 100 pF (disc) |
| Capacitors 124 | 1.8 pF |
| Capacitors 82, 126 and 146 | 12 pF |
| Capacitor 42 | 0.75 pF |
| Capacitors 44 and 94 | Constructed as shown |
| Inductors 80, 120 and 174 | 300 mh. (approximately RF choke) |
| Inductor 34 | three loops as approx. as shown (FIG. 2) |
| Inductors 36 and 86 | lines as shown (FIG. 3) |
| Inductor 136 | line as shown (FIG. 6) |
| Inductors 56, 180 and 182 | bent leads of respectively transistor 48 and diode 180 |
| Impedance Device 156 | specially formed as shown (FIG. 4A) |

The inductors with the exception of the coils 80, 120 and 174 are specially formed elements for the tuner 10 rather than being commercially available coils. Similarly, the variable capacitors 44 and 94 and the impedance device 157 are specially formed.

The ability to use leads and specially formed pieces as circuit elements is one advantage of the present invention. This eliminates the expense of additional parts and extra manufacturing steps in assembling the additional parts.

The particular UHF tuner 10 as depicted in FIG. 2 is especially adapted for being mounted with a solid-state VHF tuner of the type described and claimed in the continuation-in-part application Ser. No. 839,162 of Thomas F. Gossard and Mutsuo Nakanishi entitled "Solid State Television Tuner," filed coincidental herewith, which application is a continuing application of an application Ser. No. 671,011 of the same inventors and which is similarly entitled, or of the type described in the application Ser. No. 839,168 of Mutsuo Nakanishi entitled "Solid State Television Tuner," filed coincidental herewith, all of which applications are assigned to the assignee of the present invention. These applications describe VHF solid-state television tuners housed in a similar manner to the housing 26 and having provision for receiving a UHF derived IF signal and translating that signal to their IF outputs. When mounted with such a VHF tuner the tuner 10 may employ one of the VHF tuner's walls to also serve as its end wall. To facilitate the mounting of the two tuners together the tuner 10 of FIG. 2 is provided with tab extensions 26T on its outer end walls. When so mounted the feedthrough capacitor 178 is provided in the jointly used housing wall between the two tuners. Alternatively it may be desired, for numerous reasons including space or design limitations, to mount the UHF tuner independently. In this case the housing would completely enclose the tuner, as in the second embodiment that will be taken up next.

DESCRIPTION OF SECOND EMBODIMENT

Figure 5:
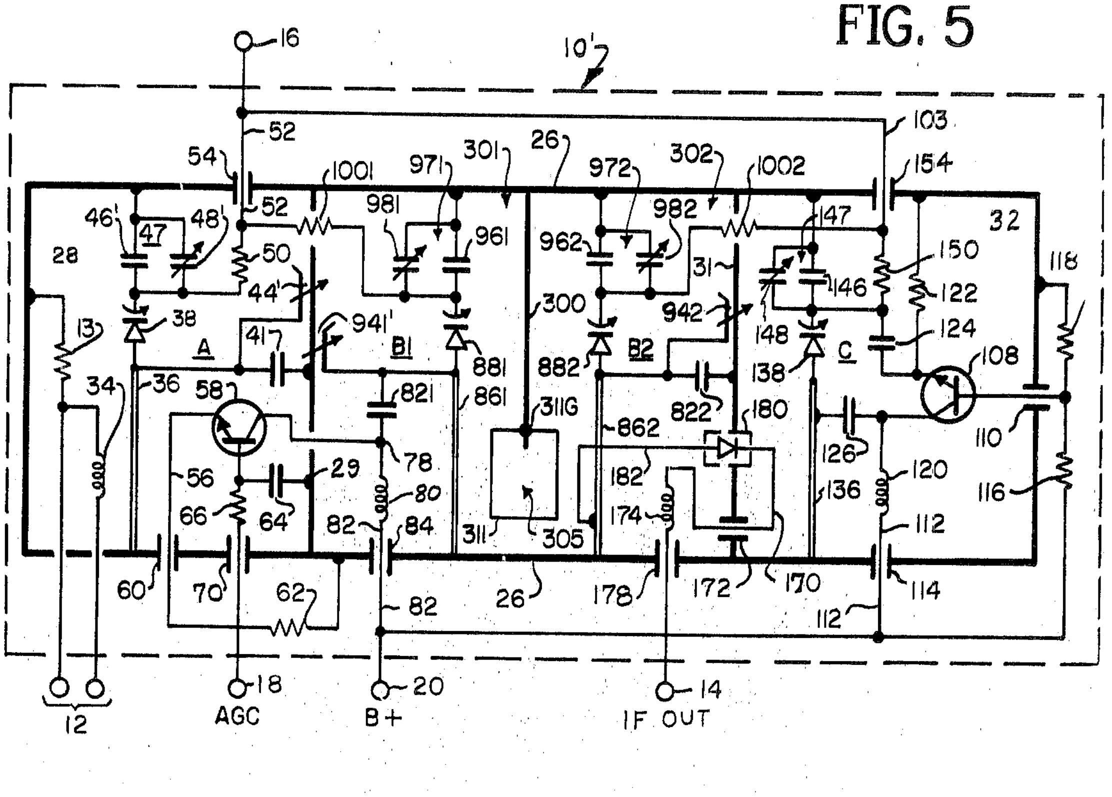
FIG. 5 is a generally schematic circuit diagram partially in pictorial form of a second embodiment of the present invention.
Figure 6:
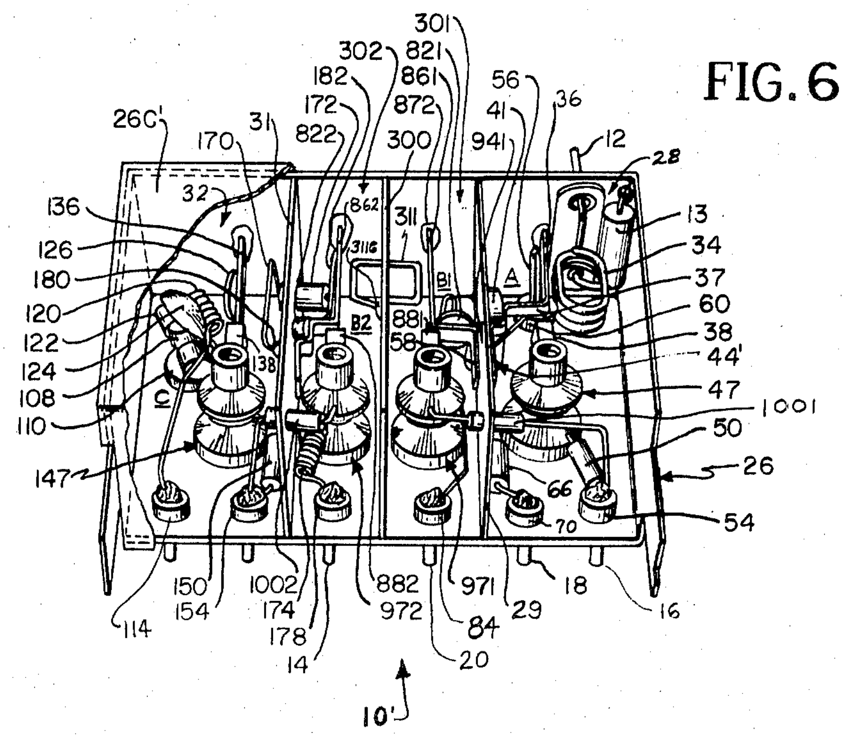
FIG. 6 is a perspective view of the interior of the UHF tuner of FIG. 5 with its cover partly broken away and shown partly in dashed lines so as to show interior parts and their configuration and orientation.

Referring now to FIGS. 5 and 6 there is depicted an alternative embodiment of the present invention, comprising a tuner for tuning the American UHF band. This alternative tuner is generally similar to the tuner 10 of FIGS. 1–4 and is designated by the numeral 10'.

The tuner 10' has many parts that are similar to corresponding elements of the tuner 10 and these parts bear the same indicia as in that embodiment. Thus the tuner 10' similarly includes a generally rectangular housing 26 with a cover 26C' (FIG. 6). In this tuner 10' the cover 26C' encloses the top of the tuner as well as one wall thereof.

The interior volume defined by the housing 26 has a pair of dividing walls 29 and 31 as in the previous embodiment but also includes an additional internal conductive shielding wall, designated 300, which is parallel to and spaced equidistant between the walls 29 and 31 to divide the volume between those walls into two cavities. The first of these two cavities defined between the wall 29 and the wall 300 is generally designated 301 while the other is generally designated 302.

The tuner 10' differs from the tuner 10 principally by the provision of double tuned interstage circuit having two coupled tuned circuits generally designated B1 and B2, respectively, and by the use of a special capacitance unit in each of the four tuned circuits. These capacitance units are generally designated 47, 971, 972 and 147, respectively.

Referring particularly now to FIG. 5, the tuner 10' includes a pair of antenna inputs 12, coupled to an antenna coil 34 within the housing 26. The coil 34 is housed in a first cavity 28 and has one end thereof grounded through resistor 13. This resistor 13 may, as is depicted in FIG. 5, be housed within the cavity 28 or may alternatively be attached without the housing 26.

The antenna coil 34 is inductively coupled to an inductive element 36, one end of which is grounded and the other end of which is connected to one side of solid state variable capacitance 38 of the varactor or varicap diode type. The inductor 36 is connected to the anode of the varicap diode 38. The cathode of the diode 38 is connected through the capacitance unit 47, which includes a fixed capacitance 46' and a variable capacitance 48', to ground. The cathode of the varactor diode 38 is also connected through a resistor 50 to a center conductor 52 of a feedthrough capacitor 54. This line 52, is, in turn, connected outside of the housing 26 to the tuning voltage input 16. The junction between the inductive element 36 and the diode 38 is further connected through a capacitor 41 to ground and through a variable or trimmer capacitance 44' to ground.

As best shown in FIG. 6, the inductor 36 and the variable capacitance 44' are preferably formed from a unitary strip of flat wire generally designated 37 and the capacitor 41 is preferably a leadless disc capacitor having one side soldered to the interior grounded wall 29 and the other side soldered to a portion of the unit 37.

Referring again to FIG. 5, the inductor 36, together with the varicap diode 38, the fixed capacitor 41, the trimmer capacitor 44', and the capacitance unit 47 constitute the first tuned circuit, designated by the letter A, for the emphasizing or preselecting one channel from a range of channel signals that may be impressed upon the antenna input 12.

An inductance 56 which may be a simple straight wire portion, is provided adjacent to the inductor 36 and is inductively coupled thereto. This inductor 56 is connected at one of its ends to the emitter of a radiofrequency amplifying device 58 of the NPN transistor type and serves to couple the preselected channel signal from the circuit A to the transistor 58. The other end of the inductor 56 is connected as a center conductor of a feedthrough capacitor 60. This center conductor of the feedthrough capacitor 60 is conducted through resistor 62 mounted without the housing 26 to ground. The resistor 62 functions to help provide DC operating bias for the transistor 58.

The base of the transistor 58 is connected through capacitor 64 to ground and also through resistor 66 and the central conductor of a feedthrough capacitor 70 to an automatic gain control (AGC) input terminal 18. In this embodiment of the invention the voltage dividing network of the tuner 10 is not shown as this particular tuner is designed for use only with AGC. However such a bias network would be included, if desired. The capacitor 64 is of such a size so as to constitute very low impedance to signals in the American UHF radiofrequency range. As such it constitutes an RF shunt path to ground and for RF-AC circuit analysis purposes the transistor 58 is in the grounded base configuration. The collector of the transistor 58 is connected to a terminal 78 within the cavity 301. As in the previous embodiment the transistor 58 is preferably partially mounted through an opening in the wall 29.

The volume within the housing 26 is divided into four zones or cavities by the three dividing walls 29, 300 and 31. In the previous embodiment only two internal walls were provided. This embodiment retains these walls 29 and 31 which define the cavities 28 and 32. The central area between the walls 31 and 29 corresponding to the cavity 30 of the tuner 10 is in this tuner further divided by the central dividing wall 300 into the two cavities 301 and 302 which house, respectively, the first tuned circuit B1, and the second tuned circuit B2.

Direct current biasing for the radio frequency amplifying transistor 58 is provided from a B+ input 20 through a conductor 82 which as the center conductor of a feedthrough capacitor 84 passes through the housing 26 into the cavity 301. Within the cavity 301 the line 82 is connected through a radio frequency choke coil 80 to a junction terminal 78 which is connected to the collector of the transistor 58.

The tuned circuit B1 includes an inductor or RF line element 861 with one end grounded to the wall of the housing 26 and its other end connected to the anode of a solid state voltage variable capacitance 881 of the varicap or varactor diode type. A junction between the varactor diode 881 and the inductor 861 is also connected via a capacitor 821 to the junction point 78. This junction between the inductor 861 and the diode 881 is further connected to ground via a trimmer capacitor 941. The cathode of the diode 881 is connected through the capacitance unit 971 connected to ground. The capacitance unit 971 includes a first fixed capacitor 961 connected in parallel to a trimmer capacitor 981. The cathode of the diode 881 is further connected to the tuning voltage via an isolation resistor 1001 which passes through an opening formed in the wall 29 to have its far end connected to the central conductor 52 of the feedthrough capacitor 54 and thus to tuning voltage input 16.

Figure 7:
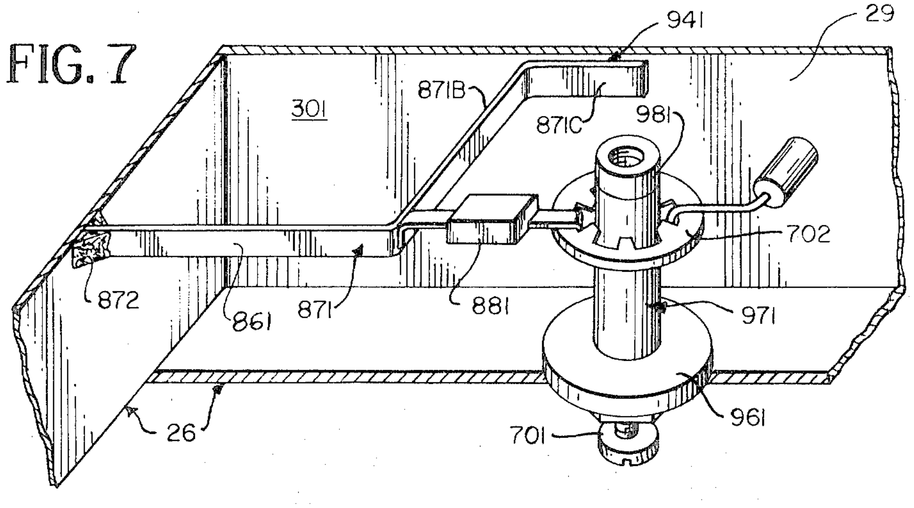
FIG. 7 is a perspective view of a broken-out portion of the tuner of FIGS. 5 and 6 with some parts and solder removed to show more clearly the physical interconnections of certain other parts.

Referring now to FIGS. 6 and 7, and especially to FIG. 7, there is depicted the preferred construction of the major elements of the circuit B1. As it can be there seen, the inductor 861 is preferably formed as part of a unitary member generally designated 871 which comprises a generally Z-shaped flat wire segment cantilevered out from and attached to the wall at 872 and having, in addition to the straight portion that forms the inductor 861, central portion 871B and an end portion 871C. The central portion 871B of the unit 871 preferably functions to support a leadless soldered disc capacitor 821 (not shown on FIG. 7) and also functions as a connection between the anode of the varactor diode 881 and the end segment 871C. This segment 871C is bent at approximately a right angle to the bridging portion 871B and is approximately parallel to but spaced from the side wall 29 so as to form the trimmer capacitor 941 therewith. This trimmer capacitor 941 formed by the segment 871C and the sidewall 29 is varied by physically moving the segment 871C closer to or farther away from the wall 29.

The capacitance units 47, 971, 972, and 147 are preferably of the type shown and described in Edwards U.S. Pat. No. 3,286,139, entitled, "Trimmer Condensor" which issued on Nov. 15, 1968 and is assigned to the same assignee as the present invention. As can be best seen also in FIG. 7, the capacitor unit 971, which is typical of these four units, comprises a fixed disc capacitor portion 961 and a variable capacitor 981. The variable capacitor 981 is varied or adjusted by adjusting the position of a setscrew 701 which extends without the housing 26 for ease of access during alignment and service. The capacitor unit 971 has an added advantage of forming a convenient stanchion for the attachment of the various parts.

It is preferred that a washer, designated 702 in FIG. 7 which has internally extending teeth for gripping the unit 971, be employed for ease of attachment of the parts to the unit 971. This washer 702 is sized so as to slip in a tight-fitting fit over the generally cylindrical portion of the trimmer capacitor 981. Once thus fitted the washer 702 will maintain a snug fit even when parts are placed on it. The anode lead of the varactor diode 881 is preferably bent down and positioned into one of the recesses formed between the internally extending teeth of the washer 702. This construction, it might be here noted, provides for ease of interchangeability of different makes of varactors as this arrangement allows for different lead lengths to be accommodated without redesign of the tuner or special trimming of the leads. One lead of the resistor 1001 which passes through the wall 29 is preferably attached to the washer 702 in a similar manner. After being so physically attached these elements are soldered to the washer and to the outer wall of the trimmer capacitor portion of the unit 971, as best shown in FIG. 6.

Referring again to FIG. 5, in summary to this point, the signal amplified and selected by the tuning of the preselector circuit A and amplified in the radio frequency amplifier including the transistor 58 is further selected and adjacent television signals and noise rejected by the interstage coupling tuned circuit B1. This signal from the circuit B1 is coupled into the circuit B2 in the cavity 302 primarily by means of an opening, designated 305, in the wall 300.

The coupling between the circuits B1 and B2 may be altered and varied by adjustment of the physical position of the closed loop conductor 311 which forms a shorted turn. The shorted turn 311 is preferably formed by making a wire segment into a square loop within the approximate opening 305 and by having the wire's two ends electrically grounded and soldered at 311G to the center wall 300. The opening in the center wall 300 is preferably formed by a simple square cut out portion at the bottom corner of the wall 300 and the shorted turn 311 is preferably placed in the center of that square cut in a plane that lies approximately through the inductance elements 861 and 862. By rotating the square closed loop 311 through other planes about an axis lying in the cut out portion or by compressing or expanding the volume enclosed by the loop, its effect on the mutual inductance between the tuned circuits B1 and B2 can be varied. The opening between the cavities 301 and 302 provides for inductive coupling between the inductor 861 and the similar inductor 862 of the circuit B2.

The inductor 862 has one end grounded to the wall of the outside housing 26 and its other end connected to one side of a solid-state voltage-controlled capacitance 882 of the varicap or varactor diode type. The anode of a varactor diode 882 is joined to the inductor 862, which junction is also connected through a capacitor 822 to the grounded wall 31 and through a variable trimmer capacitor 942 to ground.

Again, the connection between the variable trimmer capacitor 942 as well as its construction is preferably, as best illustrated in FIG. 6, similar to that of the preselector element 37. That is, the inductor 862 and the variable trimmer capacitor 942 are preferably formed from a unity member of flat wire bent in a generally stair step shape over the leadless disc capacitor 822.

The cathode of the diode 882 is connected to capacitance unit 972 which comprises a fixed capacitor 962 in parallel circuit connection with a trimmer capacitor 982. The unit 972 is preferably identical to the unit 971 (FIG. 7) in construction and is connected between the cathode of the varicap diode 882 and ground. The junction between the unit 972 and the diode 982 is further connected via a resistor 1002 the source of tuning voltage. The resistor 1002 passes through an opening in the wall 31 and is connected to a conductor 103 which serves as the central conductor of a feedthrough capacitor 154. The line 103, outside of the housing 26, is connected to the tuning voltage input terminal 16.

The cavity 32 contains oscillator circuit generally similar to the oscillator circuit of the previous tuner 10, that is, it includes a tuned circuit C and a transistor 108. The circuit C has a line inductor element 136 connected between ground and a solid state voltage variable capacitance 138 of the varicap diode type. The inductor 136 is connected to the anode of the varicap diode 138 whose cathode is connected to the capacitance unit 147. This unit 147 comprises a trimmer capacitor 148 connected in parallel with the fixed capacitor 1469. This parallel connection is connected between the cathode of the diode 138 and ground. The unit 147 is preferably constructed in the same manner as the units 47, 971 and 972. Also included as part of the circuit is a resistor 150 which is connected between the line 103 and the cathode of the varactor diode 138.

The oscillator circuit includes as its active element the transistor 108 which is of the NPN type and whose emitter is connected through a capacitance 124 to the cathode of the varactor 138. The collector of the transistor 108 is similarly connected through a capacitor 126 to the inductor 136 adjacent to the anode of the diode 138. The operating DC bias for the transistor 108 is established by having the emitter of the transistor 108 connected through a choke coil 120 to a central conductor 112 of a feedthrough capacitor 114. Outside of the housing 26 the line 112 is connected to the positive bias B+ input terminal 20. The base of the transistor 108 is connected through a special feedthrough type capacitor 110 to the junction of a pair of series connected voltage dividing resistors 116 and 118 to establish its operating DC bias level. The other side from the junction of the resistor 118 is grounded and the other side from the junction of resistor 116 connected to the B+ line 112. The operating bias level for the emitter of the transistor 108 is provided by a resistor 122 which is connected between the emitter and ground. The base of the transistor is, for oscillatory frequency AC analysis, at ground potential through the capacitor 110.

Figure 8:
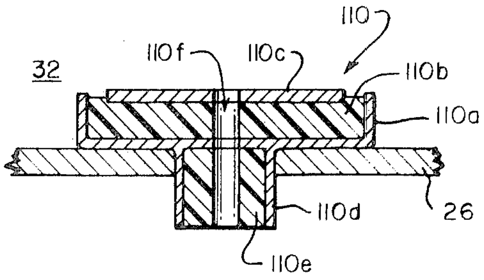
FIG. 8 is a sectional elevational view of a particular type of feedthrough capacitor employed in the tuner of FIGS. 5–7.

The preferred construction of the capacitor 110 is best shown in FIG. 8. Referring to that figure, the capacitor 110 comprises a round generally cup-shaped member of conductive material 110*a* which has an insulating disc 110*b* inserted therein. Atop this insulation disc 110*b* is a flat circular conductive plate 110*c* which it is centered thereon but has a smaller diameter than either the cup 110*a* or insulation disc 110*b* so as not to be in electrical contact with the cup 110*a*.

On the opposite side from the disc 110*b* the cup 110*a* has an outstanding conductive hollow cylinder member 110*b* of a smaller diameter, centrally located thereon and preferably formed unitarily with the cup 110*a*. Within this hollow cylinder and filling it is a cylinder of insulating material, designated 110*e*.

Located at the central axis of each of the elements of the capacitor 110 is a transverse bore 110*f* which passes through the capacitor 110 and thus opens at its upper surface, the disc 110*c*, and its lower surface, the insulation cylinder 110*e*. The capacitor 110 has its cup member 110*a* seated on and soldered to the inside of the wall of the housing 26 within the cavity 32, with the outstanding cylinder portions 110*d* and 110*e* projecting through the housing 26 to the outside thereof. The bore hole 110*f* is sized to accommodate the base lead of the transistor 108.

It can thus be seen that the capacitor 110 is in many respects like a disc capacitor and behaves electrically like such as seen from within the cavity 32, but is also like a feedthrough capacitor especially as seen from without the housing 26.

Referring again in FIGS. 5 and 6, it can be seen that the output of the oscillator is coupled from the inductor 136 to an inductor 170 within the cavity 32. This inductor 170 is formed by a single partial loop of the cathode lead of a mixer diode 180. The diode 180 is preferably mounted and positioned within a conformingly sized hole in the RF shield wall 31. The far end of its anode lead-inductor 170 is connected to the central conductor of a feedthrough capacitor 172 which also is mounted through the wall 31 into the cavity 302 wherein it is connected to one end of a radio frequency choke coil 174. The other end of this coil is connected to the center conductor of a feedthrough capacitor 178 through the housing 26 to the IF OUT terminal 14. The mixer diode 180 has its anode lead 182 connected to the inductor 862 at a tap position 183 thereon which is above ground potential.

For completeness of the disclosure of and for illustration of the embodiment of the invention comprising tuner 10' of FIGS. 5–8 but not to limit the scope of the present invention the following illustrative values and circuit component types are submitted. It should be understood that elements unlisted here are the same as in the previous embodiment:

| Element | Value or Type or Description |
|---|---|
| Resistor 13 | 680K Ohms |
| Resistors 50, 1001, 1002 & 150 | 10K Ohms |
| Resistor 66 | 1K Ohms |
| Resistor 122 | 870 Ohms |
| Resistors 116, 118 | 4.7K Ohms |
| Resistor 62 | 390 Ohms |
| Capacitors 46', 961 & 962 | 24 pF |
| Capacitor 146 | 18 pF |
| Capacitors 48', 981, 982, & 148 | 0.5–3.5 pF |
| Capacitors 41, and 822 | 0.75 pF |
| Capacitor 64 | 100 pF |
| Capacitors 126 & 821 | 12 pF |
| Capacitors 124 | 1.8 pF |
| (Feedthrough) Capacitors 172 & 178 | 47 pF |
| Feedthrough Capacitor 110 | 1,000 pF |
| Feedthrough Capacitors 54, 154, 114, 84 & 70 | 1,000 pF |
| Feedthrough Capacitor (without pin) | 1,000 pF |
| Varicap Diodes 38, 881, 882 | BB 105B |
| & 138 | (Matched) |

OPERATION OF THE SECOND EMBODIMENT

The operation of the tuner 10' is generally similar to that of the tuner 10 and reference to the above description of the operation of the tuner may be had for the details of the operation of the tuner 10'. Only the differences in operation will be here noted.

The tuner 10' differs in detailed operation from the tuner 10 mainly by the provision of an additional tuned circuit in the interstage portion of the tuner. This circuit is tuned in the same manner as the other tuned circuit.

The two tuned circuits <u>B1</u> and <u>B2</u> together form a tunable band-pass filter, the bandwidth of which is determined by a fixed coupling and a variable coupling. The fixed coupling comprises the opening 305 while a variable coupling is provided by the loop 311. Once the tuner is aligned and the loop positioned a fixed bandwidth is established.

As compared with the three circuit tuner 10 the overall output of this tuner 10' is slightly less but its selectivity and image rejection is better. The performance of an operational model of the tuner 10' which was constructed and tested was:

| | |
|---|---|
| Noise figure | 14 db. maximum |
| Insertion loss | 8 db. maximum |
| Gain taper | 6 db. maximum |
| Image rejection | 45 db. minimum |
| V.S.W.R. at any bias | 2.5=1 |
| Gain reduction | 25 db. minimum |

METHOD OF ASSEMBLY

The above-described tuners are designed to be and have the advantage of being dimensionally interchangeable. Furthermore the chassis 26 in each case is preferably the same except for the additional wall 300 added in the four circuit tuner 10'. This greatly simplifies their manufacture as it allows either version to be produced by the same facility with but a minimum of variation in the method of assembly.

Figure 9:
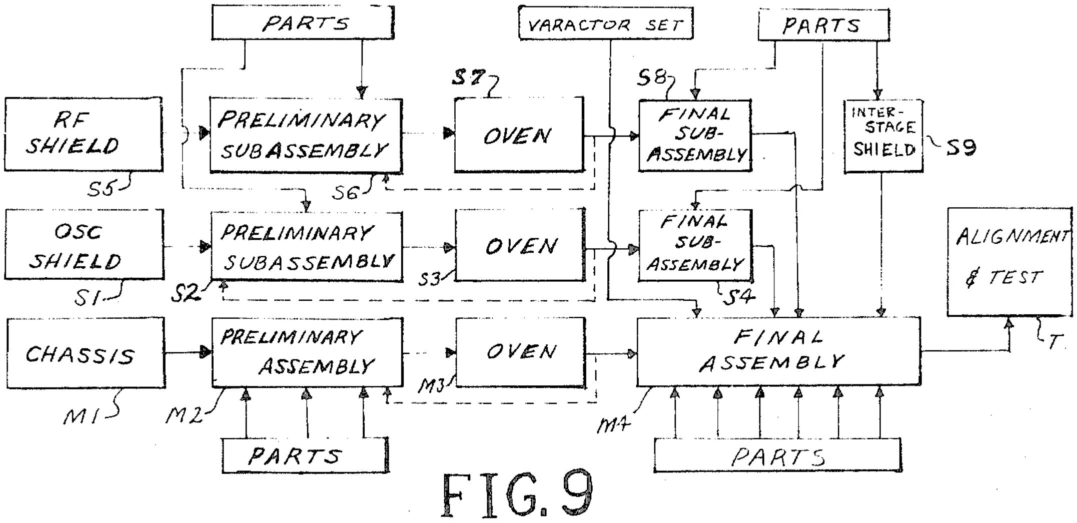
FIG. 9 is a flow diagram illustrating the method of manufacture of the tuners of FIGS. 1-8.

Referring to FIG. 9, this method will now be described. The tuner 10 or 10' is preferably assembled in one main continuous process from chassis 26, at station M1, to finished product at the test and alignment station T1. However several subassemblies and preformed parts are employed in this process, which parts and subassemblies may be processed either contemporaneously with the main assembly process or a sufficient supply may be manufactured prior to the actual main assembly process. As the tuner 10' is slightly more complex the assembly procedure will be described for that tuner, it being understood that slight modification can be made for the simpler tuner 10.

The main subassemblies are: (1) the antenna input assembly comprising the antenna terminals 12, the antenna coil 34, the electrostatic discharge resistor 13 and the insulated mounting for the terminals and coil; (2) the oscillator shield assembly comprising the oscillator shield wall 31, the feedthrough capacitor 172, the diode 180 and its inductor leads 170 and 172, the IF peaking coil 174, and the capacitor 822 (in tuner 10' only); (3) the RF shield assembly comprising the radiofrequency shield wall 29, the transistor 58, and, in tuner 10', the coil 80, the resistor 66, and the disc capacitors 41 and 64; and (4) for tuner 10' only, the interstage shield assembly comprising the wall 300 and the loop 311.

The antenna input assembly is preferably constructed by clip soldering the terminals 12 to the coil 34 with one end of the resistor 13 inserted therein.

The oscillator shield assembly is made by the steps of (a) furnishing the preformed oscillator shield wall 31 at station S1, (b) transferring this preformed wall 31 onto an oven fixture and (c) placing solder containing feedthrough capacitor 172 and disc capacitor 882 thereon at the station S2, (d) heating the wall 31 so as to melt solder on the capacitors 41 and 64 by passing the wall and fixture through, in a continuous pass, an oven at station S3, (e) removing the shield 31 from the oven fixture and placing it on an assembly fixture at station S4, (f) cutting and forming the leads of the diode 180 into the desired inductors 120 and 182 and (g) placing the diode within the wall 31, (h) attaching the end of the lead 170 to the center conductor of the feedthrough, (i) attaching the IF peaking coil 174, and (j) soldering the last-mentioned connections. The completed subassembly may then be removed from the fixtures, transferred to the final assembly line. The oven fixtures and the assembly fixtures are returned to be revised as indicated by the dashed lines in FIG. 9.

The RF shield assembly is assembled in the following steps: (a) providing a preformed shield wall 39, at station S5, (b) placing the shield on an oven fixture, (c) mounting soldered containing disc capacitors 41 and 64 thereon (station S6), (d) heating the shield 29 to a temperature and for a period sufficient to melt the solder on the capacitor 41 and 64 and to form a good physical and electrical connection between them and the shield 29, again this is preferably done by passing the wall in the oven fixture continuously through a oven, at station S7, (e) removing shield from the oven fixture, placing it in a subassembly fixture and placing the transistor 58 therein, (f) placing the resistor 66 on the capacitor 64, and soldering the resistor thereto and the ground lead of the transistor 58 to the wall 29, and attaching and soldering the choke coil 80 to the collector lead of the transistor 58. These last steps could be performed at a final subassembly station S8 from which the finished subassembly would be forwarded to the final assembly station of the tuner.

The interstage shield assembly is formed simply by attaching the coupling loop 311 to the shield 300 at the station S9 and forwarded to the tuner final assembly line.

The main assembly line starts at the station M1 at which a performed chassis 26 having appropriately sized and positioned apertures is provided. From this station the chassis is placed on an oven fixture and the following parts inserted therein: the feedthrough capacitors 54, 70, 84, 114 and 154, a solder washer and the special feedthrough capacitor 110, solder washers and the fixed capacitors 46′, 146, 961 and 962 in their appropriate positions, together with a solder ring and the capacitor 178. This is preferably performed at an assembly station M2. Thereafter the chassis 26 is heated for a sufficient period to cause the solder to melt and form a good physical and electrical connection between these parts and the chassis. This is done at station M3 preferably by passing in a continuous pass, the chassis through an oven.

From the station M3 the chassis 26 is passed to a final assembly station or line M4 at which line the final assembly of the tuner takes place. The preferred steps and there sequence are as follows:

i. assembly and solder the remainder of the capacitance units 47, 147, 971 and 972, insert and solder the resistor 120 in place, solder closed the corners of the housing 26, and insert and mount the antenna subassembly;
ii. using a special holding fixture, insert the special line-inductor elements 36, 136, 861 and 862 therein and position the housing over the holding fixture so that each of these lines are properly positioned, solder these in place, add and solder additional interior parts including the capacitor 126, the resistors 50, and 150;
iii. in one operation insert the matched set of varactor or varicap diodes 38, 138, 881 and 882 and spot solder them to their respective lines 36, 136, 861 and 862 making sure that they are aligned in the correct orientation;
iv. insert and solder, serially, the RF shield assembly, interstage shield assembly and the oscillator shield assembly and wire their components, and
v. attach and solder in place the remaining circuit elements and solder all housing tabs to insure a proper electrical shielding.

It should be noted that the insertion and soldering of all the varactor diodes in one operation insures against the mixing of matched sets. It has been discovered by experimentation than tuning varactor diodes within a selected set have substantially equal capacitance verses applied tuning voltage characteristics but that another set of diodes from the same manufacture may differ therefrom by as much as ten percent of the capacitance at a given applied voltage. An even larger disparity in capacitance has been found between diodes of the same rating from different manufactures.

Even with this advantageous method of assembly it has been found necessary to provide and adjustment for the capacitance of the varactor diodes by the addition of trimmer capacitances in series with the diode capacitors. However at the American UHF frequencies herein involved it is extremely difficult to make a relatively low cost trimmer capacitor. The trimmer capacitors required must be stable, have low losses and must have a very low inductance. In addition such a capacitor should have a definitive capacitance-temperature characteristic. The available capacitors variation range should be of the order of approximately plus or minus 15% from a larger value of the order of 25 pf. The trimmer capacitor possessing these characteristics is found in the capacitance unit of the type 971 depicted in FIG. 7.

The varactor diodes are normally available today only in sets of matched diodes. These are most often diodes made from the same section of semiconductor substrate altered, processed and packaged in the same manner so as to have nearly identical characteristics. It is therefor essential to provide a method of assembly and a tuner structure that assures that a given set of diodes is never physically separated. In other words the diodes must be assembled into the tuner at only one location on the assembly line. Also as diodes from different manufacturers will differ in physical size and in lead shape and length provision has been made in the above-described tuner structure to accommodate these differences. The provisions of the internal toothed washer such as 702 in FIG. 7 allows for variation in lead length and ease of multiple mounting of the diode sets at one station.

TEST AND ALIGNMENT

The described tuners of the present invention have as one of their advantages a facility for easy and quick alignment and test with a minimum of equipment and labor.

The three circuit tuner 10 of FIGS. 1–5 lends itself to a simplified method of testing and alignment employing only a few pieces of test equipment. For example only a power supply, signal generator for selectively producing 470, 760 and 890 MHz., voltmeter, ampmeter, and noise meter, plus switching, amplifying and impedance matching equipment may be used.

The tuner 10 to be tested is first placed in a special fixture wherein the input and output terminals are properly connected through a controlled switching network. The output of the tuner is coupled to the voltmeter, ampmeter and noise meter. The noise meter is preferably modified so as to automatically stop a tuning sweep voltage when such voltage is employed whenever the noise level exceeds a preset maximum.

The first step in aligning and testing the tuner 10 is to apply the tuning voltage corresponding to the lowest channel signal (for example 0.8 v.) to the tuner while impressing the 470 MHz. signal onto the antenna inputs. In this state first the oscillator trimmer capacitor 148 and then the RF trimmer capacitor 98 and the preselector circuit trimmer capacitor 48 are adjusted to obtain the maximum output voltage signal. When achieved, the inductor 170 formed by the single partial turn of the lead from the mixer diode 180 is physically adjusted to obtain a maximum output current above a specified minimum. (If the minimum cannot be reached the tuner is rejected.)

The next step is to apply the high channel signal (890 MHz.) and the predetermined tuning voltage corresponding thereto (for example, 20 v.) to the tuner. In this state the oscillator impedance device 156 is first physically adjusted to obtain maximum output, and then the mixer trimmer capacitor 94 and the preselector trimmer capacitor 44 are physically adjusted to obtain maximum output.

oven fixture and placing it on an assembly fixture at station S4, (f) cutting and forming the leads of the diode 180 into the desired inductors 120 and 182 and (g) placing the diode within the wall 31, (h) attaching the end of the lead 170 to the center conductor of the feedthrough, (i) attaching the IF peaking coil 174, and (j) soldering the last-mentioned connections. The completed subassembly may then be removed from the fixtures, transferred to the final assembly line. The oven fixtures and the assembly fixtures are returned to be revised as indicated by the dashed lines in FIG. 9.

The RF shield assembly is assembled in the following steps: (a) providing a preformed shield wall 39, at station S5, (b) placing the shield on an oven fixture, (c) mounting soldered containing disc capacitors 41 and 64 thereon (station S6), (d) heating the shield 29 to a temperature and for a period sufficient to melt the solder on the capacitor 41 and 64 and to form a good physical and electrical connection between them and the shield 29, again this is preferably done by passing the wall in the oven fixture continuously through a oven, at station S7, (e) removing shield from the oven fixture, placing it in a subassembly fixture and placing the transistor 58 therein, (f) placing the resistor 66 on the capacitor 64, and soldering the resistor thereto and the ground lead of the transistor 58 to the wall 29, and attaching and soldering the choke coil 80 to the collector lead of the transistor 58. These last steps could be performed at a final subassembly station S8 from which the finished subassembly would be forwarded to the final assembly station of the tuner.

The interstage shield assembly is formed simply by attaching the coupling loop 311 to the shield 300 at the station S9 and forwarded to the tuner final assembly line.

The main assembly line starts at the station M1 at which a performed chassis 26 having appropriately sized and positioned apertures is provided. From this station the chassis is placed on an oven fixture and the following parts inserted therein: the feedthrough capacitors 54, 70, 84, 114 and 154, a solder washer and the special feedthrough capacitor 110, solder washers and the fixed capacitors 46', 146, 961 and 962 in their appropriate positions, together with a solder ring and the capacitor 178. This is preferably performed at an assembly station M2. Thereafter the chassis 26 is heated for a sufficient period to cause the solder to melt and form a good physical and electrical connection between these parts and the chassis. This is done at station M3 preferably by passing in a continuous pass, the chassis through an oven.

From the station M3 the chassis 26 is passed to a final assembly station or line M4 at which line the final assembly of the tuner takes place. The preferred steps and there sequence are as follows:

i. assembly and solder the remainder of the capacitance units 47, 147, 971 and 972, insert and solder the resistor 120 in place, solder closed the corners of the housing 26, and insert and mount the antenna subassembly;
ii. using a special holding fixture, insert the special line-inductor elements 36, 136, 861 and 862 therein and position the housing over the holding fixture so that each of these lines are properly positioned, solder these in place, add and solder additional interior parts including the capacitor 126, the resistors 50, and 150;
iii. in one operation insert the matched set of varactor or varicap diodes 38, 138, 881 and 882 and spot solder them to their respective lines 36, 136, 861 and 862 making sure that they are aligned in the correct orientation;
iv. insert and solder, serially, the RF shield assembly, interstage shield assembly and the oscillator shield assembly and wire their components, and
v. attach and solder in place the remaining circuit elements and solder all housing tabs to insure a proper electrical shielding.

It should be noted that the insertion and soldering of all the varactor diodes in one operation insures against the mixing of matched sets. It has been discovered by experimentation than tuning varactor diodes within a selected set have substantially equal capacitance verses applied tuning voltage characteristics but that another set of diodes from the same manufacture may differ therefrom by as much as ten percent of the capacitance at a given applied voltage. An even larger disparity in capacitance has been found between diodes of the same rating from different manufactures.

Even with this advantageous method of assembly it has been found necessary to provide and adjustment for the capacitance of the varactor diodes by the addition of trimmer capacitances in series with the diode capacitors. However at the American UHF frequencies herein involved it is extremely difficult to make a relatively low cost trimmer capacitor. The trimmer capacitors required must be stable, have low losses and must have a very low inductance. In addition such a capacitor should have a definitive capacitance-temperature characteristic. The available capacitors variation range should be of the order of approximately plus or minus 15% from a larger value of the order of 25 pf. The trimmer capacitor possessing these characteristics is found in the capacitance unit of the type 971 depicted in FIG. 7.

The varactor diodes are normally available today only in sets of matched diodes. These are most often diodes made from the same section of semiconductor substrate altered, processed and packaged in the same manner so as to have nearly identical characteristics. It is therefor essential to provide a method of assembly and a tuner structure that assures that a given set of diodes is never physically separated. In other words the diodes must be assembled into the tuner at only one location on the assembly line. Also as diodes from different manufacturers will differ in physical size and in lead shape and length provision has been made in the above-described tuner structure to accommodate these differences. The provisions of the internal toothed washer such as 702 in FIG. 7 allows for variation in lead length and ease of multiple mounting of the diode sets at one station.

TEST AND ALIGNMENT

The described tuners of the present invention have as one of their advantages a facility for easy and quick alignment and test with a minimum of equipment and labor.

The three circuit tuner 10 of FIGS. 1–5 lends itself to a simplified method of testing and alignment employing only a few pieces of test equipment. For example only a power supply, signal generator for selectively producing 470, 760 and 890 MHz., voltmeter, ampmeter, and noise meter, plus switching, amplifying and impedance matching equipment may be used.

The tuner 10 to be tested is first placed in a special fixture wherein the input and output terminals are properly connected through a controlled switching network. The output of the tuner is coupled to the voltmeter, ampmeter and noise meter. The noise meter is preferably modified so as to automatically stop a tuning sweep voltage when such voltage is employed whenever the noise level exceeds a preset maximum.

The first step in aligning and testing the tuner 10 is to apply the tuning voltage corresponding to the lowest channel signal (for example 0.8 v.) to the tuner while impressing the 470 MHz. signal onto the antenna inputs. In this state first the oscillator trimmer capacitor 148 and then the RF trimmer capacitor 98 and the preselector circuit trimmer capacitor 48 are adjusted to obtain the maximum output voltage signal. When achieved, the inductor 170 formed by the single partial turn of the lead from the mixer diode 180 is physically adjusted to obtain a maximum output current above a specified minimum. (If the minimum cannot be reached the tuner is rejected.)

The next step is to apply the high channel signal (890 MHz.) and the predetermined tuning voltage corresponding thereto (for example, 20 v.) to the tuner. In this state the oscillator impedance device 156 is first physically adjusted to obtain maximum output, and then the mixer trimmer capacitor 94 and the preselector trimmer capacitor 44 are physically adjusted to obtain maximum output.

The third step is to apply the intermediate frequency (760 MHz.) and the corresponding tuning voltage thereto (e.g., 10 v.). In this state the antenna loop 34 is physically adjusted to obtain a maximum output and the output current is checked not to be above a specified level (e.g., 5 ma.).

The next step in testing and aligning the tuner is to reapply the signals and tuning voltage of the first step (low end) and to readjust the trimmers as therein.

Finally, the tuner is switched so as to have no input signal impressed on its antenna terminals and the sweep voltage (at a relative slow pace, e.g., 15 V./sec.) is applied and the noise meter is activated. If the tuning range is swept through without the noise level exceeding a preselected level the tuner is aligned and ready for use. If however the noise level at any tuning voltage within the range exceeds the standard selected then the antenna loop may be physically adjusted to lower the noise level and the tuning voltage sweep repeated. If it again fails to meet the required noise levels, the interstage trimmer 94 and/or the trimmer 44 are physically adjusted to reduce the noise figure and the sweep repeated again. If the tuner again fails it may be rejected. A rejected tuner may have been erroneously constructed or may be in need of special servicing.

The tuner 10' of FIGS. 6–8 is preferably aligned by use of a variation of this method. In this variation a conventional UHF frequency sweep generator and oscilloscope are employed.

The first step in this procedure is to apply the low end tuning voltage and adjust the oscillator trimmer capacitor 140 for the proper frequency. The output is then maximized by adjusting the trimmer capacitors 48', 981 and 982 of the tuned circuits A, B1 and B2. The band width as observed on the oscilloscope is then adjusted by means of the coupling loop 311.

The next step is to adjust the tuning voltage for the high end signal and to adjust trimmers 44', 941 and 942 for maximum output.

The third step is to slowly reduce the tuning voltage while observing the tracking and response curves. Any unsatisfactory responses are to be corrected by adjustment of the loop 311 and/or the trimmers 44', 841 and 842.

The last step is to, at the low end, adjust the injection current to the desired level and to recheck the tracking by running over the tuning range again.

In the above-described tuners 10 and 10' as with all UHF tuners, the interrelation of the parts, connections and ground points within the chassis 26 are critical and a change may disalign the tuners. However the above-described tuners have proven to be less sensitive to such disaligning than the previously known American UHF tuners.

As should now be clear from the above set forth description, the present invention provides a new and improved UHF television tuner which is compatible with solid-state television receivers and easily adapted to remote control as its tuning function is performed by a varying direct current voltage. The present tuners, by eliminating the ganged capacitor blades of previous American UHF tuners, also eliminate the resulting problems such as microphonic oscillations of those previous tuners. As should also be now clear the described tuners are easily constructed, aligned and tested and are adaptable to novel and advantageous assembly techniques.

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention.

I claim as my invention:

1. A television tuner for tuning the American UHF television frequency band comprising:

a conductive shielding housing defining an interior volume;

an input into said housing for received UHF television frequency band signals;

a first voltage tuned circuit within said housing, coupled to said UHF television input and comprising first inductance and first solid-state voltage-variable capacitance coupled to said inductance, for selecting a channel signal from the UHF band;

an oscillator in said housing including an amplifier device and an oscillator frequency determining voltage tuned circuit comprising an oscillator inductance and oscillator solid-state voltage-variable capacitance coupled to said oscillator inductance;

a mixer in said housing coupled to said first voltage tuned circuit for receiving therefrom selected channel signals, and also coupled to said oscillator for receiving therefrom its oscillatory signals, for mixing the selected channel signal and the oscillatory signal to produce a modulated IF signal;

an IF output from said housing coupled to said mixer for receiving the modulated IF signal therefrom; and a tuning voltage input into said housing for receiving a selectively variable tuning voltage, coupled to said solid-state voltage-variable capacitance of said first tuned circuit and coupled to said oscillatory solid state voltage-variable capacitance of said oscillator tuned circuit for controlling in common both of said tuned circuits whereby said oscillator is caused to track said first tuned circuit by a predetermined constant frequency difference to generate at said mixer a modulated IF signal of constant predetermined IF carrier frequencies for any channel signal in the UHF range;

said tuner including a RF amplifier device coupled between said first tuned circuit and said mixer for amplifying the signals selected by said first tuned circuit, and a third voltage-tuned circuit coupled between said RF amplifier device and said mixer for further emphasizing the selected and amplified channel signals and for deemphasizing and shunting out nonselected signals and noise, comprising third inductance and third solid state voltage-variable capacitance coupled to said third inductor; and said third solid-state voltage-variable capacitance of said third voltage-tuned circuit being coupled to said tuning voltage input for control in common with said first tuned circuit and said oscillator tuned circuit;

said first solid-state voltage-variable capacitance, said oscillator solid state voltage-variable capacitance, and said third solid state voltage-variable capacitance, and each of them, are varicap diodes whose electrical characteristics are generally similar to one another;

and wherein said housing is conductive, at ground potential, and defines at least three longitudinal boxlike cavities and said first, said oscillator, and said third inductances are each longitudinal conductive line elements longitudinally disposed within different ones of the cavities, with one longitudinal end thereof grounded and the other longitudinal end connected to, respectively, said first, said oscillator, and said third varicap diodes;

and wherein a trimmer reactance (44 or 156) is provided between the inductance element and ground in at least one of said first, oscillator and third voltage tuned circuits which trimmer reactance is formed by a planar conductive segment electrically connected to one of said housing and said element and extended adjacent to but spaced from the other of said housing and said element, which trimmer reactance affixed so as to be adjustable by physically displacing it from and to said other of said housing and said element.

2. The television tuner for tuning the American UHF television frequency band as defined in claim 1, wherein:

the inductance element in said at least one voltage tuned circuit is formed by a flat wire segment; and said trimmer reactance is essentially a capacitive reactance and is formed unitarily with the inductance element of said at least one voltage tuned circuit and constitutes an extension of said flat wire segment, which extension proceeds from the junction of the inductance element and the varicap diode of said at least one voltage tuned circuit.

3. The television tuner for tuning the American UHF television frequency band as defined in claim 1, wherein:

said trimmer reactance formed by said generally planar segment (156) which segment is connected, physically and electrically, along one edge (157) to said housing to extend longitudinally along said inductance element of said at least one voltage tuned circuit.

4. The television tuner for tuning the American UHF television frequency band as defined in claim 1, wherein:

said oscillator includes:

a transistor having a base, collector and emitter as said amplifying device, with the base at effective oscillatory frequency ground potential; and said solid-state voltage-variable capacitor is coupled across the emitter-collector circuit of said oscillator transistor.

5. In a television tuner for tuning the UHF television frequency band and for selecting therefrom one television frequency channel signal and converting that channel signal into a modulated IF signal of predetermined IF carrier frequencies of the type having a RF amplifier, an oscillator and a mixer, the improvement comprising:

having a solid-state voltage-variable capacitance tuned interstage double tuned circuit coupled between the RF amplifier and the mixer, said interstage double tuned circuit comprising:

a first tuned circuit (B1) coupled to the RF amplifier including:

a first inductance (861), and a first solid-state voltage-variable capacitance (881) coupled to said first inductance; and a second tuned circuit (B2) coupled to the mixer and said first tuned circuit (B1) and including:

a second inductance (862), and a second solid state voltage-variable capacitance (882) coupled to said second inductance;

tuning voltage input; and having means connecting said tuning voltage input to said first solid-state voltage-variable capacitance and to said second solid-state voltage-variable capacitance for selectively varying the capacitance thereof, said tuner includes a housing defining a first interstage cavity (301), a second interstage cavity (302) and an oscillator cavity (32) with said first interstage tuned circuit in said first interstage cavity and said second interstage tuned circuit in said second interstage cavity, said first and said second interstage cavities being separated by a conductive shielding wall (300) and said first and said second interstage tuned circuits being coupled together by inductive coupling through a cutout portion of said wall;

the oscillator of said tuner including an oscillatory frequency tuned circuit comprising an oscillator inductance and an oscillator solid-state voltage tuned capacitance;

each of said first, second and oscillator solid state voltage tuned capacitances being a varactor diode matched in electric characteristics to each other;

each of said first, second and oscillator inductances being longitudinal line elements extending within respectively said first interstage, said second interstage and said oscillator cavities and each of which have two longitudinal ends one of which is connected to said housing and the other of which is connected to the respective first, second and oscillator voltage-variable capacitance varactor diodes;

said oscillator varactor diode being connected to said tuning voltage input so that said oscillator tuned circuit may track along with said interstage double tuned circuit;

said tuner including a closed conductive loop which is physically adjustable in said housing attached to the wall dividing said first interstage cavity from said second interstage cavity in the cutout portion thereof to provide manually adjustable means for altering the coupling between said first interstage tuned circuit and said second interstage tuned circuit;

the mixer being a solid state diode having two leads one of which is in said second interstage cavity and is connected to said second inductance line element; and the RF amplifier including a transistor whose output is coupled to the junction of said first inductance line element and said first capacitance varactor diode.

6. In a UHF television tuner of the type including at least one tuned circuit for selecting a television channel signal and an oscillator tuned circuit for generating an oscillator signal having conductive housing walls bounding a boxlike mounting cavity, the improvement of having at least one of the tuned circuits being a voltage tuned circuit mounted in the cavity and comprising:

a flat wire element having one end grounded to a conductive housing wall, said element providing an inductance segment extending in spaced relation to the remaining housing walls and terminating at the grounded end;

a capacitance segment at the other end and a generally transverse segment connecting said inductance and said capacitance segments in lengthwise offset parallel relation, said segments lying in planes transverse to the plane of the main housing wall;

a solid-state voltage-variable capacitor connected in tunable relationship with said inductance segment; and a tuning voltage input line coupled to said capacitor.

7. In a UHF television tuner having conductive housing walls, one being an intermediate partition wall, bounding adjacent mounting cavities, the improvement comprising an interstage double tuned circuit having:

a flat wire input inductance segment in one cavity extending parallel to the intermediate partition wall and grounded to a conductive housing wall;

an input solid state voltage-variable capacitor connected in tunable relation with said input inductance segment;

a flat wire output inductance segment in the other cavity extending parallel to the intermediate partition wall and grounded to a conductive housing wall;

an output solid-state voltage-variable capacitor connected in tunable relation with said output inductance segment;

a tuning voltage input line coupled to each of said solid state voltage-variable capacitors; and a closed conductive loop element mounted in a wall opening of said intermediate partition wall to inductively couple said segments.

* * * * *